(12) United States Patent
Leeser

(10) Patent No.: US 10,879,048 B2
(45) Date of Patent: Dec. 29, 2020

(54) FLOW THROUGH LINE CHARGE VOLUME

(71) Applicant: Lam Research Corporation, Fremont, CA (US)

(72) Inventor: Karl F. Leeser, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/720,656

(22) Filed: Dec. 19, 2019

(65) Prior Publication Data

US 2020/0126758 A1   Apr. 23, 2020

Related U.S. Application Data

(62) Division of application No. 15/051,594, filed on Feb. 23, 2016, now Pat. No. 10,515,783.

(51) Int. Cl.
*H01J 37/32* (2006.01)
*C23C 16/455* (2006.01)
*C23C 14/22* (2006.01)
*H01L 21/67* (2006.01)
*C23C 16/448* (2006.01)

(52) U.S. Cl.
CPC .......... *H01J 37/3244* (2013.01); *C23C 14/22* (2013.01); *C23C 16/45544* (2013.01); *C23C 16/45561* (2013.01); *H01J 37/32009* (2013.01); *H01J 37/32449* (2013.01); *H01L 21/67069* (2013.01); *H01L 21/67253* (2013.01); *C23C 16/448* (2013.01); *H01J 2237/332* (2013.01); *H01J 2237/334* (2013.01); *H01L 21/67011* (2013.01)

(58) Field of Classification Search
CPC ............ H01J 37/3244; H01J 37/32009; H01J 2237/332; H01J 2237/334; H01J 37/32449; C23C 14/22; C23C 16/45544; C23C 16/45561; C23C 16/448; H01L 21/67069; H01L 21/67253; H01L 21/67011
See application file for complete search history.

(56) References Cited

U.S. PATENT DOCUMENTS

| | | | |
|---|---|---|---|
| 4,064,550 A | 12/1977 | Dias | 361/278 |
| 5,165,281 A | 11/1992 | Bell | 361/283.4 |
| 5,753,820 A | 5/1998 | Reed | 73/706 |
| 6,174,377 B1 * | 1/2001 | Doering | H01L 21/67167 118/729 |
| 6,913,031 B2 * | 7/2005 | Nawata | G05D 7/0635 137/12 |
| 7,021,148 B2 | 4/2006 | Kuhn | 73/715 |
| 7,137,301 B2 | 11/2006 | Grudzien | 73/718 |
| 7,481,240 B2 | 1/2009 | Nagaoka | 118/715 |

(Continued)

*Primary Examiner* — Jeffrie R Lund
(74) *Attorney, Agent, or Firm* — Penilla IP, APC

(57) ABSTRACT

A charge volume configuration for use in delivery of gas to a reactor for processing semiconductor wafers is provided. A charge volume includes a chamber that extends between a proximal end and a distal end. A base connected to the proximal end of the chamber, and the base includes an inlet port and an outlet port. A tube is disposed within the chamber. The tube has a tube diameter that is less than a chamber diameter. The tube has a connection end coupled to the inlet port at the proximal end of the chamber and an output end disposed at the distal end of the chamber.

6 Claims, 15 Drawing Sheets

(56) References Cited

U.S. PATENT DOCUMENTS

| | | | | |
|---|---|---|---|---|
| 7,628,861 | B2* | 12/2009 | Clark | C23C 16/45544 |
| | | | | 118/663 |
| 8,790,464 | B2* | 7/2014 | Meneghini | G01F 11/28 |
| | | | | 118/715 |
| 9,725,805 | B2* | 8/2017 | Kobrin | C23C 16/4485 |
| 10,312,119 | B2* | 6/2019 | Leeser | C23C 16/52 |
| 10,515,783 | B2* | 12/2019 | Leeser | H01L 21/67253 |
| 2003/0194862 | A1* | 10/2003 | Mardian | C23C 16/455 |
| | | | | 438/680 |
| 2004/0124131 | A1* | 7/2004 | Aitchison | C23C 16/45544 |
| | | | | 210/252 |
| 2005/0081787 | A1* | 4/2005 | Im | C23C 16/45544 |
| | | | | 118/715 |
| 2006/0201425 | A1* | 9/2006 | Kobrin | C23C 16/4402 |
| | | | | 118/715 |
| 2006/0207503 | A1 | 9/2006 | Meneghini | 118/715 |
| 2006/0278276 | A1 | 12/2006 | Tanaka | 137/487.5 |
| 2007/0113663 | A1 | 5/2007 | Crockett | 73/718 |
| 2007/0281492 | A1* | 12/2007 | Chinn | H01L 21/02126 |
| | | | | 438/725 |
| 2014/0041729 | A1 | 2/2014 | Lacouture | 137/2 |
| 2014/0083514 | A1 | 3/2014 | Ding | 137/12 |
| 2014/0309577 | A1 | 10/2014 | Thomas | 604/9 |
| 2015/0040674 | A1 | 2/2015 | Ishihara | 73/724 |
| 2017/0236735 | A1* | 8/2017 | Leeser | C23C 16/52 |
| | | | | 137/12 |
| 2017/0243722 | A1* | 8/2017 | Leeser | C23C 16/448 |
| 2020/0126758 | A1* | 4/2020 | Leeser | C23C 16/45561 |

\* cited by examiner

SIDE-VIEW

CROSS-SECTION VIEW

FLOW THROUGH LINE CHARGE VOLUME

CROSS-REFERENCE TO RELATED APPLICATIONS

This Application claims priority as a divisional from U.S. patent application Ser. No. 15/051,594 filed on Feb. 23, 2016, (U.S. Pat. No. 10,515,783, issued on Dec. 24, 2019) entitled "Flow Through Line Charge Volume", which is related to U.S. patent application Ser. No. 15/046,214, filed on Feb. 17, 2016, entitled "Line Charge Volume with Integrated Pressure Measurement," which are incorporated herein by reference.

BACKGROUND

1. Field of the Disclosure

The present embodiments relate to semiconductor processing equipment, and in particular, to line charge volume delivery to processing equipment.

2. Description of the Related Art

Semiconductor equipment used to fabricate semiconductor devices include various integrated systems. Depending on the application, there is often a need to deliver process gases to a reactor, e.g., when used to deposit a film over a semiconductor wafer. For instance, some reactors are used to perform atomic layer deposition (ALD), also known as atomic layer chemical vapor deposition (ALCVD). These deposition methods are used to produce very thin films that are highly conformal, smooth, and possess excellent physical properties. ALD uses volatile gases, solids, or vapors that are sequentially introduced (or pulsed) over a heated substrate.

Typically, a first precursor is introduced as a gas, which is absorbed (or adsorbed) into the substrate and the reactor chamber is cleared of the gaseous precursor. A second precursor is introduced as a gas, which reacts with the absorbed precursor to form a monolayer of the desired material. By regulating this sequence, the films produced by ALD are deposited a monolayer at a time by repeatedly switching the sequential flow of two or more reactive gases over the substrate. Thus, the supply of such gases and controlling the amount of gases introduced in various phases becomes important to achieving higher quality films.

In some implementations, a "charge volume" method is used for discretely metering precise bursts of chemistry into the process chamber of the reactor. For example, FIG. 1 shows a system 100 where a line charge volume (LCV) 102 is used to supply bursts of gas into the reactor 120. In a first life cycle state, the outlet valve 106 is closed, the inlet valve 104 is opened, and the line charge volume 102 is exposed to a flow of gas from an upstream source 130. This may be a pressure to which the line charge volume 102 ultimately equilibrates or a metered flow for a specified exposure time. The amount of chemistry in the line charge volume can be derived from suitable gas laws. If the chemistry conforms to the ideal gas law, then: $m = PV/(R\_m\, T)$.

In a second life cycle state, the inlet valve 104 is closed, and the outlet valve 106 is opened and the entire volume of the line charge volume 102 is exposed to the reactor 120 resulting in an outflow of gas from the line charge volume 102 to the reactor 120. As shown, the reactor 120 may include a showerhead 108 and a pedestal 112 that supports a substrate 110. The burst of gas from the line charge volume 102 is therefore delivered by the showerhead 108 to the processing region over the substrate 110. In the second state, it is desirable to have a very high conductance between the line charge volume 102 and the reactor 120.

In other configurations, a surface mount integrated gas system (IGS) of the charge volume (LCV) may be used, as shown in FIG. 2. In this configuration, a charge volume 122 and a capacitance diaphragm gauge (CDG) 124 is provided in tandem to define the LCV 102. This arrangement has two sub-optimum characteristics. First, the pressure reading, Pg, incurs a measurement error, where $Pg = Pv - (m/C)$ and "m" is the molecular mass and "C" is the conductance. If exposed to an upstream pressure, then after the initial transient, the mass flow difference between the charge volume 122 and the CDG 124 will be zero. However, if a gas flow is used for a specified duration, the pressure reading error will be problematic.

Second, the single-ended volume formed by the cavity in the CDG 124 is difficult to purge as it represents a dead leg. As such, single-ended designs do not lend themselves to proper purging of residual atmospheric oxygen or water vapor. During a third lifecycle state of the charge volume 122, purge gases flow through the charge volume 122, but due to the proximity of the outlet port 105 to the inlet port 103, significant recirculation occurs and purging of the distal portions of the charge volume 122 is ineffective. This is similar to how a room can be cooled with air conditioning as air in a room is exchanged over time with the air flow entering and leaving the room vents. It is possible to purge this volume, but very inefficiently, as vast volumes of purge gas must be used and significant purge time is required.

It is in this context that disclosures arise.

SUMMARY

Embodiments of the disclosure provide example configurations for a charge volume with an integrated internal tube that functions to extend an input of gas flown into the chamber of the charge volume away from the output of the gas. This configuration improves the dynamic performance of the charge volume while also enabling efficient flow-through purging. In flow-through purging, the viscosity of the gas can be used to literally push residual ambient out of the charge volume when both inlet and outlet valves are open and purge flow is admitted into and through the internal tube of the charge volume. This configuration provides for improved efficiencies in effective purging than traditional gas-exchange configurations that rely on recirculation-based purging.

In one embodiment, a charge volume for use in delivery of gas to a reactor used for processing semiconductor wafers is provided. The charge volume includes a chamber that extends between a proximal end and a distal end. A base connected to the proximal end of the chamber, and the base includes an inlet port and an outlet port. A tube is disposed within the chamber. The tube has a tube diameter that is less than a chamber diameter. The tube has a connection end coupled to the inlet port at the proximal end of the chamber and an output end disposed at the distal end of the chamber.

In one configuration, an inlet valve is interfaced between a gas delivery controller and the inlet port, and an outlet valve interfaced between the outlet port and the reactor.

In some embodiments, a length (l) is defined between the output end of the tube and the outlet port of the base and a distance (d) is defined between an outer wall of the tube and a charge volume inner surface. In some embodiments, a ratio of (l)/(d) is about 5 or greater.

In some embodiments, the output end of the tube has an opening that is aligned with the inlet port of the base.

In some embodiments, a process source is coupled to an inlet valve, and the inlet valve is connected to the inlet port of the base. The outlet port of the base is coupled to an outlet valve. The outlet valve is connected to the reactor. A controller is interfaced with the inlet valve and the outlet valve for controlling flow of process gases and purge gases to the charge volume.

In some embodiments, a pressure sensor is integrated to the chamber at the distal end. The pressure sensor has a diaphragm exposed to an interior of the chamber.

In some embodiments, the pressure sensor has a measurement side for measuring a deflection of a diaphragm. The diaphragm is directly exposed to the interior of the chamber so that pressure produced by a gas that is provided into the chamber via the output end of the tube produces a force upon the diaphragm.

In some embodiments, the measurement side includes electronics for measuring a capacitance value corresponding to a deflection of the diaphragm. The deflection is correlated to a pressure difference, the pressure difference being equivalent to a pressure volume (Pv) of the chamber.

In some embodiments, the diaphragm is at least partially defined from a metallic material and the measurement side includes one or more electrodes. The one or more electrodes are connected to the electronics for measuring the capacitance value corresponding to the deflection of the diaphragm, wherein the capacitance value changes as the diaphragm is caused to deflect toward the measurement side or away from the measurement side.

In some embodiments, the pressure sensor further includes an isolation interface. The isolation interface is disposed between the electrodes and electronics and the diaphragm.

In another embodiment, a system for processing a substrate is disclosed. The system includes charge volume for use in delivery of gas to a process chamber of the system. The system includes a process gas source, and the charge volume includes a chamber having a tubular shape extending between a proximal end and a distal end. A base is integrated to the proximal end of the chamber. The base includes an inlet port and an outlet port, and the inlet port is separated from the outlet port by a separation. A tube is disposed within the chamber. The tube has a tube diameter that is 0.5 times or less of a chamber diameter of the chamber. The tube has a connection end coupled to the base so as to surround the inlet port at the proximal end of the chamber. An output end of the tube is disposed at the distal end of the chamber. The output end of the tube has an opening that is aligned with the inlet port of the base.

In some embodiments, a length (l) is defined between the output end of the tube and the outlet port of the base and a distance (d) is defined between an outer wall of the tube and a charge volume inner surface, and a ratio of (l)/(d) is about 5 or greater.

These and other advantages will be appreciated by those skilled in the art upon reading the entire specification and the claims.

BRIEF DESCRIPTION OF THE DRAWINGS

FIG. 13 further shows one example illustration of the positioning of the tube relative to the inlet port and outlet port of the base, in accordance with one embodiment.

DESCRIPTION

Embodiments of the disclosure provide examples of charge volume components that have a modified topology to enable desired dynamic performance while also enabling efficient flow-through purging. In one configuration, the modified topology of the charge volume includes a tube added to the inlet such that the effective inlet location is not proximate to the outlet port. In flow-through purging, the viscosity of the gas can be used to literally push residual ambient out of the charge volume when both inlet and outlet valves are open and purge flow is admitted into and through the charge volume. This configuration therefore provides for improved efficiencies in effective purging than traditional gas-exchange configurations that rely on recirculation-based purging. Although some conductance restriction is added to the inlet, there is no dynamic performance loss as a result of the improved design and the outlet conductance is unmodified and remains large to enhance discharge speed.

In other configurations, designs are provided that enable direct and continuous mass estimate inside an LCV by integrating a capacitance diaphragm gauge (CDG) with the structure of a charge volume. For example, a cylindrical CDG is connected to an end of a cylindrical structure of a LCV apparatus. The disclosed design overcomes a design deficiency of a surface mount charge volume that uses a separate pressure gauge. As described below, by integrating a CDG with a charge volume into a single structure, it is possible to render faster and more efficient measurements of pressure for gas bursts that are to be delivered to a reactor. The measurement cycle avoids waiting times necessary in prior art systems to achieve equilibrium and also avoid introduction of dead legs between the charge volume and separate measurement gauges. And, as the integrated design measures pressure directly within the charge volume, there is no measurement error, since Pg=Pv. As a further benefit of the design, the mass measurement is accurate and is independent of the way the charge volume is charged, either by exposure to an upstream pressure to which it equilibrates or to a precision mass flow for a specified duration. These and other advantages will now be described below with reference to FIGS. 3-9

Figure 1:
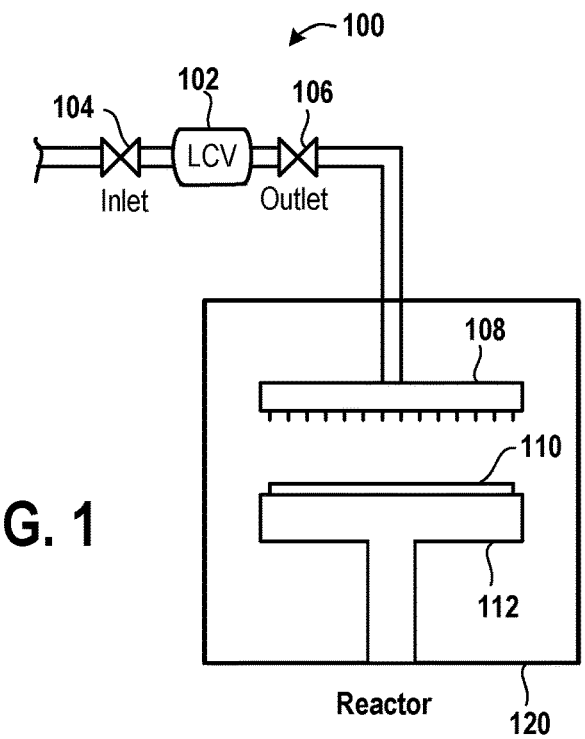
FIG. 1 illustrates an example use of a line charge volume (LCV) to provide gas to a reactor for processing a semiconductor wafer.
Figure 2:
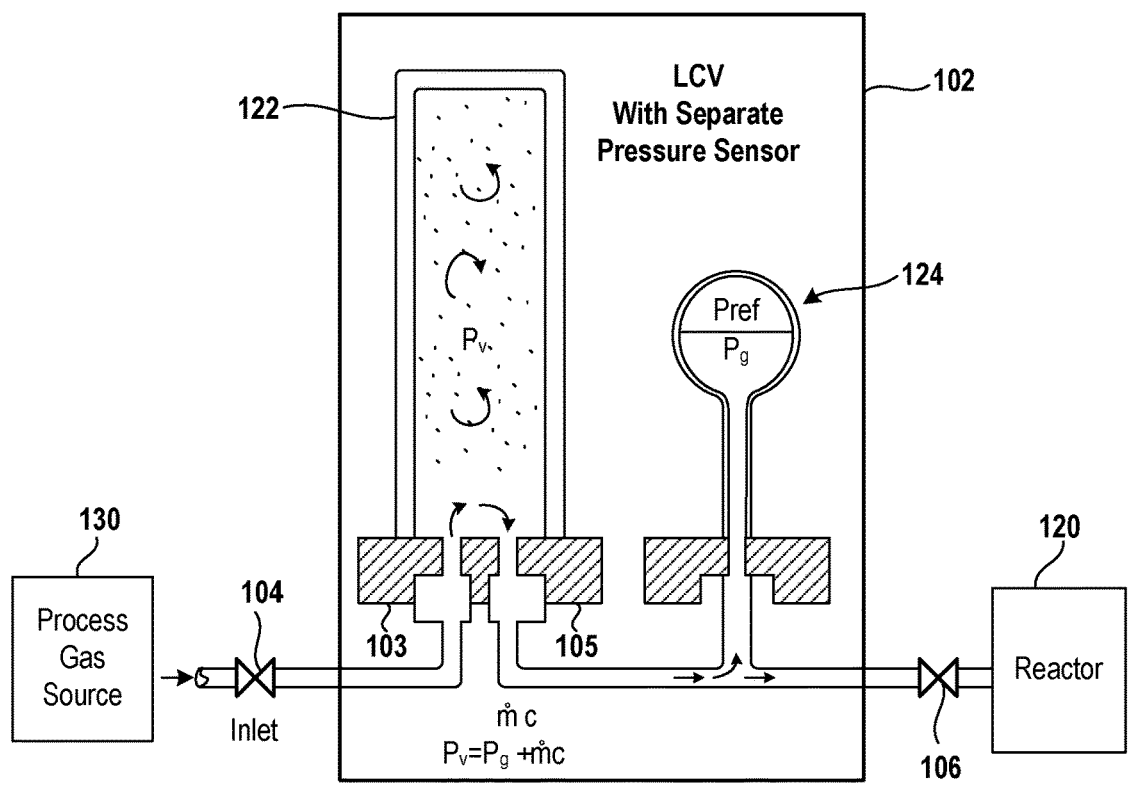
FIG. 2 illustrates the use of a separate pressure sensing system to measure pressure in a chamber used for delivery of gas to a reactor.

FIGS. 1 and 2 were described with reference to example systems and methods for measuring pressure of amounts of process gases that are to be delivered to a reactor 120. Aspects of FIGS. 1 and 2 may be useful in understanding the functionality, construction and use of pressure measurement systems described below. FIGS. 3A-9 illustrates configurations that include an integrated capacitance diaphragm gauge (CDG), and FIGS. 10-13 illustrate examples of a modified charge volume that enables efficient dynamic performance while also enabling efficient flow through purging.

Figure 3A:
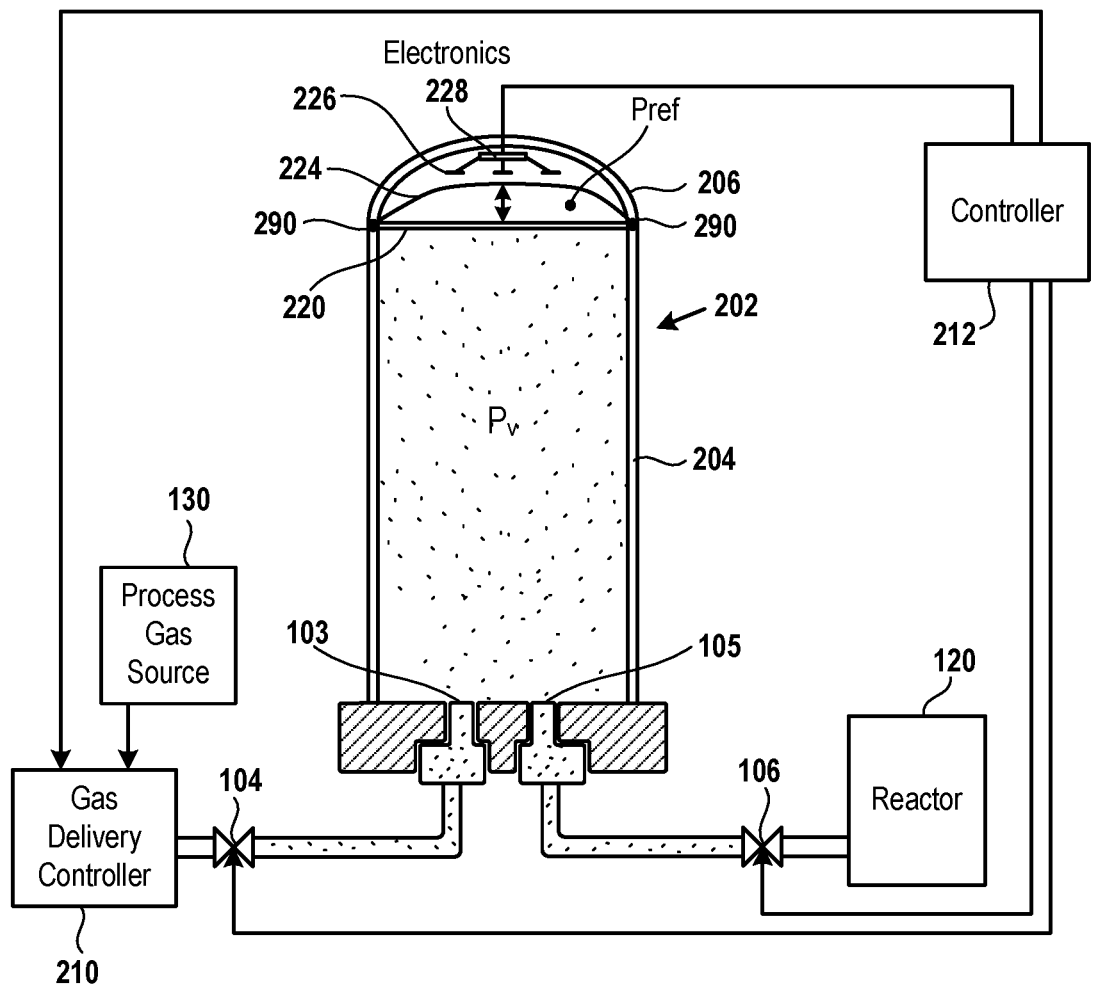
FIG. 3A illustrates an example of a processing system 200, in accordance with one embodiment.

FIG. 3A illustrates an example of a processing system 200, in accordance with one embodiment. In this example, a line charge volume (LCV) 202 is provided with the processing system 200, for providing measured amounts of process gas to a reactor 120, during operation. In systems that are implemented in the field, the reactor 120 is typically substantially larger than the LCV 202, and typically multiple LCVs 202 are utilized along each of the multiple gas lines that deliver process gases to the reactor 120 during operation. As mentioned above, the LCV 202 is configured to measure an amount of process gas and deliver a burst of the process gas to the reactor 120 when the amount of measured gas reaches the desired amount.

In order to achieve optimal processing by the reactor 120, e.g., to deposit controlled thin layers of material over a substrate, the amount of gases delivered to the reactor 120 during specific processing operation steps controlled by process recipes need to be precisely measured and delivered at a fast rate. As mentioned above, when separate measurement devices are utilized along the delivery gas line, e.g. as shown in FIG. 2, measurement delays are introduced which reduce the efficiency of the gas delivery process. Additionally, separate measurement devices also introduce problems with dead legs (e.g. plumbing interconnecting the measurement devices), which must be purged and require time to stabilize in between gas delivery operations.

The LCV 202 shown in FIG. 3A utilizes an integrated pressure sensor 206, which is directly connected to a chamber 204. In this configuration, the chamber 204 is a tubular structure that extends between a first end having an inlet port and an outlet port and a second end where the pressure sensor 206 is directly connected. The pressure sensor 206 includes a diaphragm 220 that has one side directly in contact with an interior volume of the chamber 204. The opposite side of the diaphragm 220 faces a top portion of the pressure sensor 206. The pressure sensor 206 includes a space that is conditioned with a reference pressure (Pref). In one embodiment, the reference pressure (Pref) is defined by pumping down the space between the diaphragm 220 and an isolation interface 224, and then sealing the space to maintain the reference pressure (Pref). In one embodiment, the reference pressure (Pref) is pumped down to a pressure that is in the nano-Torr range. In other embodiments, the pressure Pref is simply pumped down to near or about 40 mT. In another embodiment, the pressure Pref can simply be a pressure that is less than about 200 mT. In one embodiment, the reference pressure (Pref) is preferably set to a pressure that is lower than a lowest pressure that is to be measured by the pressure sensor 206.

The isolation interface 224 can have different shapes or contours, but preferably should be designed to isolate the space where the reference pressure (Pref) is maintained from a space where measurement devices are contained. In one embodiment, a measurement device can include electrodes 226 which are interfaced with electronics 228. In this configuration, the diaphragm 220 preferably includes metallic material or is defined from a metallic material that enables flexing. The flexing of the diaphragm 220 enables it to deflect toward the isolation interface 224 when the pressure inside the chamber 204 begins to increase when process gas is flown into the chamber 204. Thus, the surface of the diaphragm 220 will experience a force from within the chamber 204 that presses on the diaphragm 220 in toward the space where the reference pressure is maintained in the pressure sensor 206.

In one embodiment, the diaphragm 220 is allowed to deflect toward the isolation interface 224. The electrodes 226 within the pressure sensor 206 are configured to sense a change in capacitance that is due to the diaphragm 220 deforming toward the electrodes 226. The isolation interface 224 is, in one embodiment, made of a dielectric material. The empty space where the reference pressure is maintained will also have its own dielectric constant, which is air. Thus, the dielectric constant of air and the dielectric constant of the isolation interface 224 are utilized by the electronics 228 in order to determine a capacitance between the diaphragm 220 and the electrodes 226. The change in capacitance measured by electronics 228 will therefore be correlated to a sensed deflection in the diaphragm 228. The deflection that is identified by the electronics 228 are then correlated to a pressure difference ($\Delta P$) between the reference pressure and the pressure in the volume (Pv) contained in the chamber 204.

The diaphragm 220 deflects as a function of the pressure differential ($\Delta P$) applied across it. From small deflection theory, deflection of a diaphragm of radius R and thickness h is:

$$\delta = \frac{3}{16} \frac{\Delta P R^4}{h^3 E}(1-v^2)$$

In the above formula, R is the radius, E is Young's Modulus, h is a diaphragm thickness, v is Poisson's ratio, and $\Delta P = P_g - P_{ref}$. In this embodiment, since the pressure sensor 206 is integrated with the LCV 202, Pg is equal to the pressure in the volume of the chamber 204, namely Pv. Further, since Pref has been pumped down to a nano-Torr value, Pref is essentially zero. Thus, the pressure difference ($\Delta P$) is substantially equal to Pv. Consequently, by measuring the capacitance using measuring device provided by the electrodes 226 and electronics 228, it is possible to identify a deflection in the diaphragm 220 that is correlated to a pressure differential ($\Delta P$), which defines the pressure Pv in the chamber 204 of the LCV 202.

As shown, the LCV 204 has an inlet port 103 connected by a gas line to an inlet valve 104. The inlet valve 104 is connected to a gas delivery controller 210. The gas delivery controller 210 may be defined by a mass flow controller (MFC) or a pressure controller. The gas delivery controller 210 is therefore configured to meter the amount of gas supplied by the process gas source 130 into the chamber 204 of the LCV 202. In operation, the outlet valve 106 is closed when the inlet valve 104 is open to allow the chamber 204 of the LCV 202 to be charged with the process gas supplied by process gas source 130. The pressure sensor 206, which functions as a capacitance diaphragm gauge (CDG), will directly measure the pressure Pv in the chamber 204. This measurement is being done from within the chamber 204 so as to avoid any external gauge and also avoid the drawbacks associated with separate pressure sensing devices.

Once the chamber 204 reaches the desired pressure Pv, the inlet valve 104 is closed and the outlet valve 106 is opened so as to allow gas to flow out of the chamber 204 via the outlet port 105 into the reactor 120. The output of the process gas from the LCV 202 will produce a burst of gas that is measured and efficiently delivered to the reactor quickly, to enable efficient processing by the reactor 120. As will be described below, the reactor 120 may be connected to several gas lines that may include their own LCV 202, so as to provide different process gas sources 130. In practice, it is possible to use different size chambers 204 for different volume capacities, which enable the supply of different amounts of process gases to the reactor 120 based on a desired recipe. Each of the different sized chambers 204 will have a respective pressure sensor 206 coupled to a second end of the chamber 204.

The second end is opposite the inlet ports and outlet ports of the chamber 204, and represents the location at which the pressure sensor 206 is integrated with the walls of the chamber 204. The connection of the pressure sensor 206 to the chamber 204 may be accomplished in a variety of ways. One way is to weld 290 a ring around the outer surface of the pressure sensor 206 where it interfaces with a surface of the chamber 204. In another embodiment, the integration between the pressure sensor 206 and the chamber 204 may be accomplished using O-rings and clamps. In other embodiments, screws may be used to connect the pressure sensor and the chamber. In another embodiment, a combination of clamps, screws, or connecting joints may be used.

In another embodiment, one or more O-rings can be provided between the connecting surfaces of the pressure sensor 206 and the chamber 202. The O-rings can then be compressed utilizing one or more clamps or can be joined using one or more weld connections. Generally speaking, it is desired that the connection between the pressure sensor 206 and the chamber 204 provide for a pressure sealed connection, so as to avoid having gas is provided to the chamber 204 escape at the interface between the chamber 204 and the pressure sensor 206. Therefore, it should be appreciated that various ways of mechanically connecting the pressure sensor 206 to the chamber 204 is envisioned.

Further shown is an interface between controller 212 and the electronics 228 of the pressure sensor 206. The controller is configured to receive data from the electronics 228 in order to control or instruct control of the opening and closing of the inlet valve 104 and outlet valve 106. The controller 212 is also shown to be in communication with the gas delivery controller 210. The controller 212 is also configured to interface with other controls, processes, and interfacing logic of the reactor 120. Generally speaking, the controller 212 is configured to handle the processing of a recipe or multiple recipes to process semiconductor wafers in the reactor 120, and provide interfacing with the LCV 202 used to deliver process gas 130 and other LCVs 202 used to deliver other process gases during a processing operation.

Figure 3B:
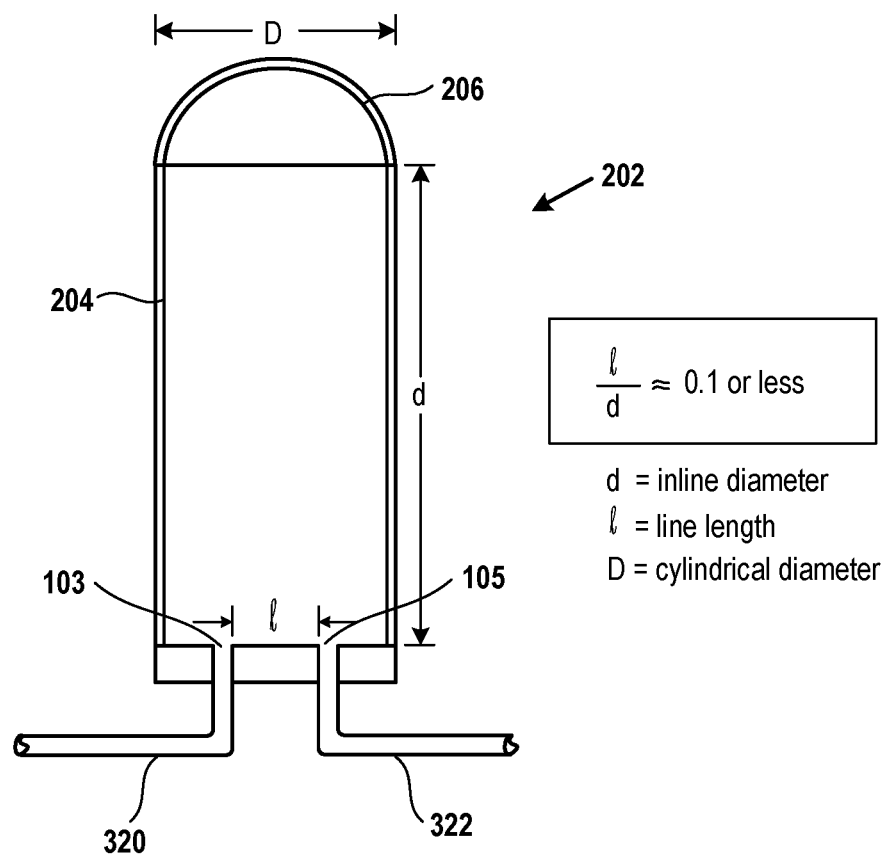
FIG. 3B illustrates example dimensioning of an LCV that includes an integrated pressure sensor.

FIG. 3B illustrates a simplified cross-section of an LCV 202, in accordance with one embodiment of the present invention. In this example, an example dimension ratio is provided, which enables efficient use of the chamber 204 and the pressure sensor 206, for delivery of process gases to a reactor 120. As shown, gas line 320 provides the process gases to the chamber 204 via inlet port 103. Gas line 322 is the output of outlet ports 105. In one configuration, the in line diameter is represented as "d", and the line length between the inlet port 103 and the outlet port 105 is represented as the line length "l". The physical diameter of the chamber 204 is represented as the cylindrical diameter "D". In one implementation, the dimensioning of the chamber 204 of the LCV 202 is configured such that the line length "l" divided by the in line diameter "d" produces a ratio that is about 0.1 or less.

By way of example, the cylindrical diameter "D" of the chamber 204 may range between 0.25 inch and 2 inches, and in other examples may range between 0.5 inch and 1 inch, and in specific examples may be about 0.75 inch. The line length "d" may range between 1 inch and 12 inches, and in other examples may range between 2 inches and 6 inches, and in specific examples may be about 4 inches. The line length "l" may range between 0.10 inch and 1 inch, and in other examples may range between 0.20 inch and 0.50 inch, and in specific examples may be about 0.25 inch. Taking the specific example of 0.25 inch for "l" and 4 inches for "d", the ratio is about 0.0625. By designing the ratio to be about 0.1 or less, it is possible to provide a more efficient outflow of gas when bursts of gas output to the reactor.

Figure 4:
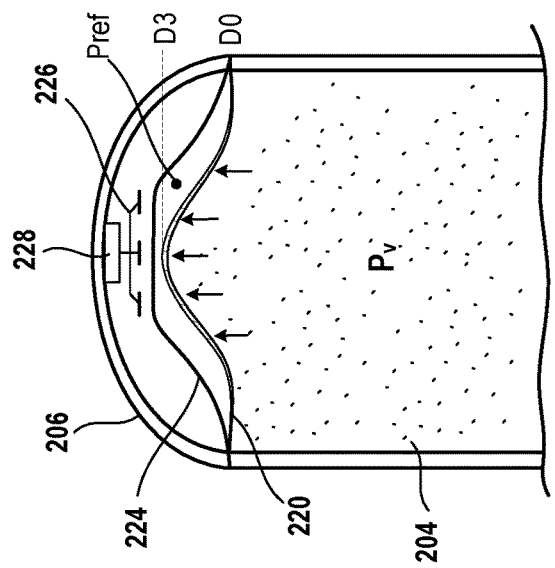
FIGS. 4-6 illustrate how a diaphragm can be deflected and measurements of the deflection can be captured by the pressure sensor.

FIG. 4 illustrates an example of the chamber 204 interfaced with the pressure sensor 206. In this example, a deflection of the diaphragm 220 is shown, for purposes of illustrating the ability to measure a capacitance using the electrodes 226 and the electronics 228. As mentioned above, the diaphragm 220 is defined by a material that is flexible and includes metallic material, such as to enable measuring a capacitance between the diaphragm 220 and the electrodes 226. In some embodiments, the material of the diaphragm 220 is completely metallic and is able to flex. In other embodiments, the material of the diaphragm 220 is defined from a rubber material that has metallic material integrated therein or coated on the backside of the diaphragm 220 that faces the electrodes 226. As more pressure builds in the chamber 204, the diaphragm 220 is shown to deflect from a level of D0 to a level of D1.

Figure 5:
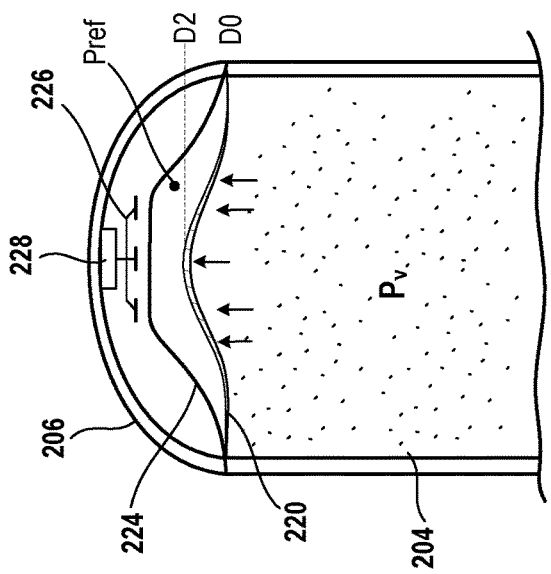
Figure 6:
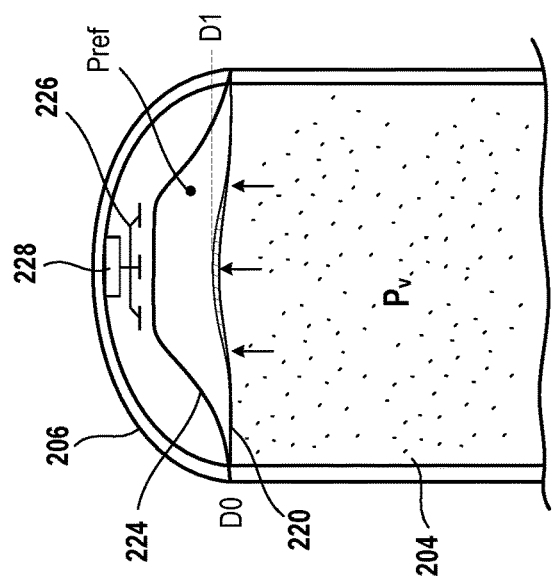

FIG. 5 shows the deflection to expand to a level of D2 and FIG. 6 shows the deflection to expand to a level of D3. The illustrated deflection shown in FIGS. 4-6 have been emphasized to convey the understanding that pressure in the chamber 204 will produce a force that pushes on the diaphragm 220 and the electronics 228 using electrodes 226 can sense and measure the amount of deflection in the diaphragm 220. It should be understood that different electrode 226 arrangements can be provided in the pressure censored 206, and thus the three-pronged electrodes shown are only examples. Thus, more or less electrodes, electrode patterns, electrode placements, reference voltages, grounding, and other electrical components or electrical measurement devices may be provided to optimize the measurement of the capacitance within the pressure sensor 206.

Figure 7A:
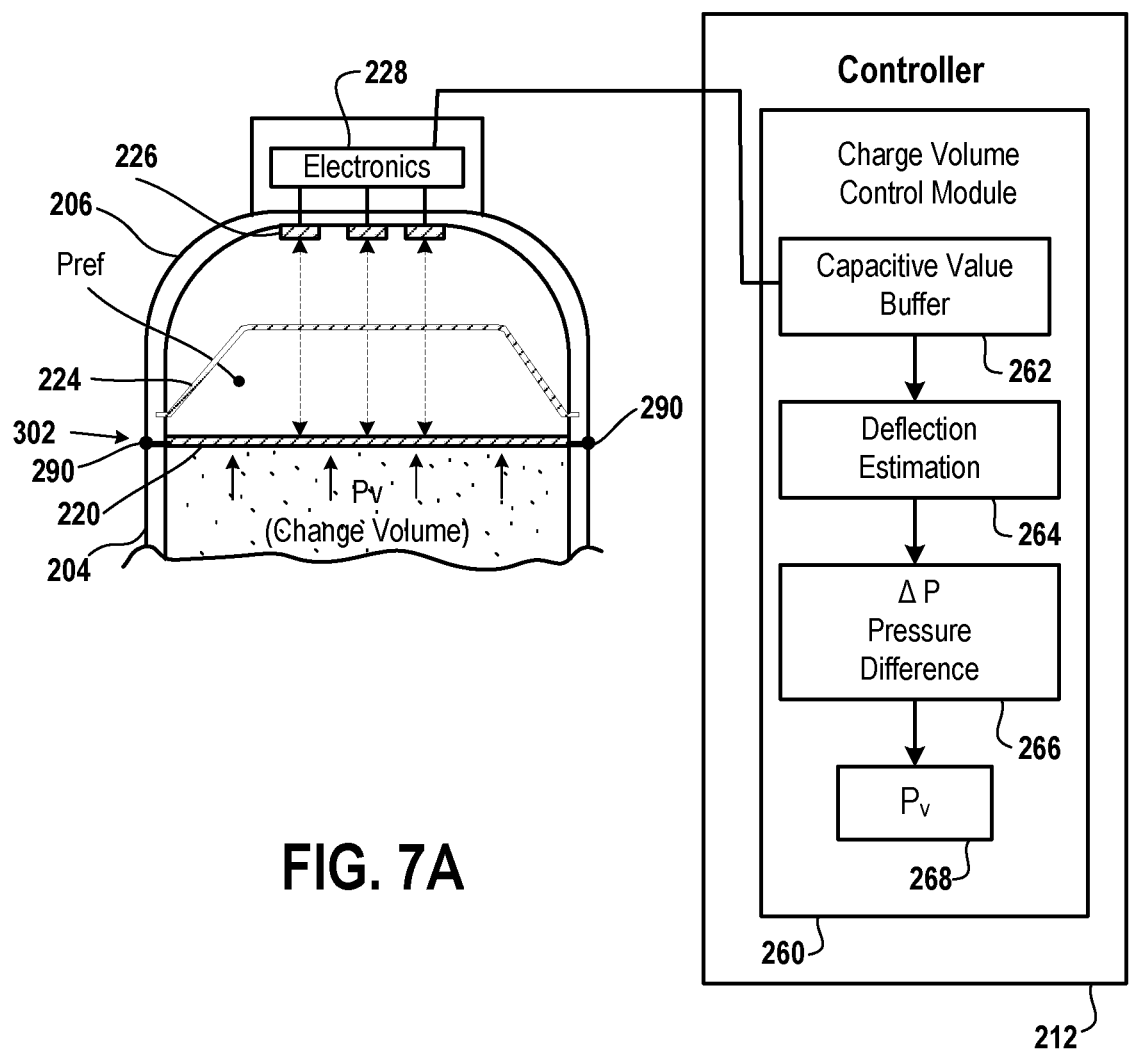
FIG. 7A illustrates an example of interfacing a controller with the pressure sensor of the integrated LCV.

FIG. 7A illustrates a cross-sectional view of the pressure sensor 206 that is integrated with the chamber 204, in accordance with one embodiment. In this example, it is shown that the electronics 228 are interfaced with the controller 212. In one embodiment, the electronics 228 can themselves generate information regarding the pressure within the chamber 204. In other embodiments, the electronics 228 provide output to the controller 212 for further processing of the sensed data by the electrodes 228 of the pressure sensor 206. The controller can include a charge volume control module 260, which is configured to receive data from the electronics 228 of the LCV 202 in order to determine the pressure in the volume (Pv).

In one embodiment, as the pressure builds within the chamber 204, the diaphragm 220 will begin to deflect toward the electrodes 226. The capacitance values being sensed (e.g., in real time) can be captured by a capacitive value buffer 262 of the charge volume control module. This information can then be processed by a deflection estimation module 264. The deflection estimation module 264 will perform one or more operations to calculate the amount of deflection. One example processing operation can be included to execute the deflection calculation operation utilizing the equation described above. In some embodiments, the equation may be simplified or modified for more efficient processing by the controller 212.

The amount of deflection produced by the deflection estimation module 264 is then used to identify a pressure difference (ΔP). In one embodiment, the amount of deflection can be correlated to a pressure difference (ΔP) by processing a lookup function. The lookup function can refer to a table of pre-calculated deflections that are correlated to values of pressure differences. In some embodiments, instead of a lookup operation, the value can be computed in real-time using a processor or firmware. In still other embodiments, the correlation values between deflection and pressure difference can be obtained from calibration data stored in a file, in a database or stored to memory of a processor, digital signal processor (DSP), or circuit. As noted above, because the reference pressure (Pref) is in the nano-Torr range, the reference pressure is negligible and can be ignored. As noted above, $\Delta P = Pv - P_{ref}$, and if Pref is zero, the pressure difference ΔP is equal to Pv, as determined by operation 260.

Figure 7B:
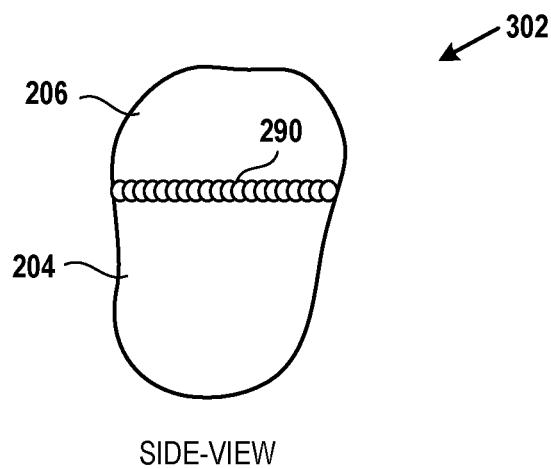
FIG. 7B illustrates example interconnections between the pressure sensor and the chamber of an LCV.
Figure 7C:
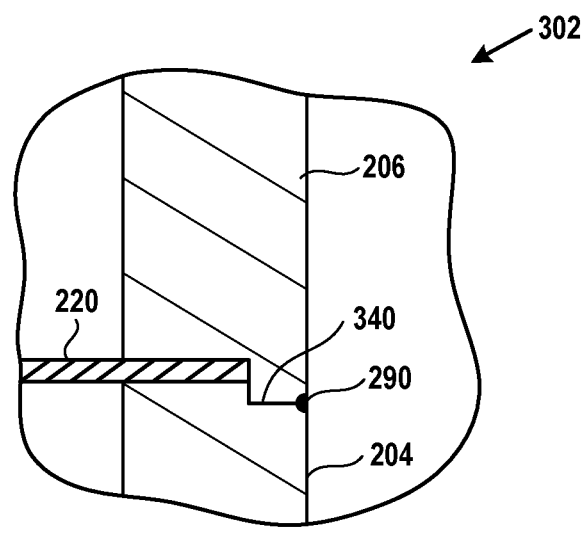
FIG. 7C provides a magnified cross-section view, which shows an example of a way of interfacing the wall of the pressure sensor with the wall of the chamber.

FIG. 7B provide a side view 302 of the interface between a surface of the chamber 204 and a surface of the pressure sensor 206. This illustration shows that a welding bead 290 has been provided to seal the interface between the surfaces. FIG. 7C provides a magnified cross-section view 302, which shows an example of a way of interfacing the wall of the pressure sensor 206 with the wall of the chamber 204. In this example, a step 340 is provided, to facilitate joining of the pressure sensor 206 with the chamber 204. The weld bead 290 can then be provided along the interface or joint of the step 340.

Further shown is the diaphragm 220 that is located approximately at the interface of the chamber 204 and the pressure sensor 206. In some embodiments, the diaphragm 220 can be integrated into different locations of the sidewalls of the pressure sensor 206 and need not be located directly at the interface between the pressure sensor 206 and the chamber 204.

Figure 8A:
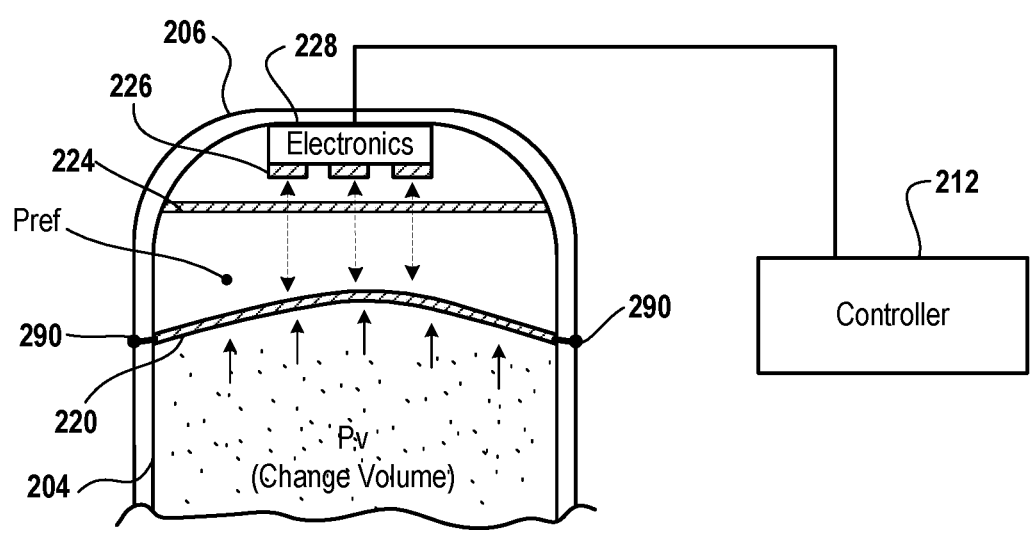
FIG. 8A illustrates an example of placing electronics within the pressure sensor body, and interfacing with a controller.

FIG. 8A illustrates an example cross-section of the pressure sensor 206 interface with the chamber 204. This example shows the electronics 228 being interfaced with the controller 212. In this example, the electronics 228 are contained within the body of the pressure sensor 206, as opposed to being interfaced to a top surface as shown in FIG. 7A. Further, it should be understood that the shape of the isolation interfaced 224 can vary depending on the desired form factor, shape, function, or design. In this example, the isolation interfaced 224 is shown to be a substantially straight interface, as opposed to being shaped as shown in FIG. 7A. So long as the isolation interface 224 isolates the electronics 228 and electrodes 226 from the space where the reference pressure (Pref) is maintained, the isolation interface 224 can take on various shapes.

Figure 8B:
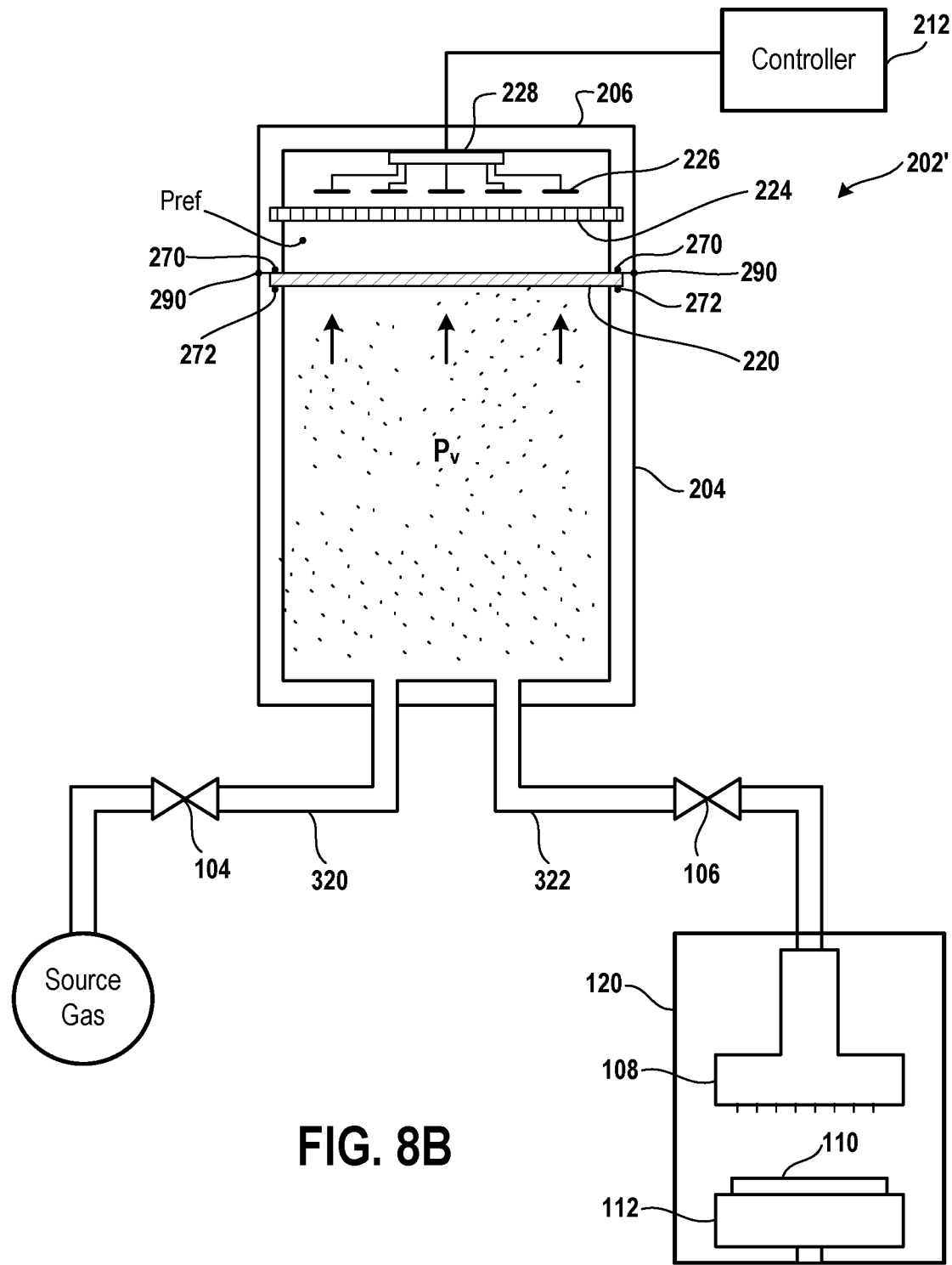
FIG. 8B illustrates an example of utilizing different electrode patterns for communicating with the metallic material of the diaphragm for sensing changes in capacitance.

FIG. 8B illustrates another example of the chamber 204 being interfaced with a pressure sensor 206. This example shows that any number of electrodes to 26 may be integrated into the pressure sensor 206, and may have different patterns, orientations, or shapes. Further shown is that the shape of the pressure sensor 206 need not have a rounded top and can have a square top. The shape of the top surface of the pressure sensor 206 is therefore configurable depending on the desired design. In this illustration, the electronics 226 are contained within the body of the pressure sensor 206 and isolated by the isolation interface 224.

This example also illustrates an optional construction, which includes providing a top O-ring 270 and a bottom O-ring 272 to provide a seal between the pressure sensor 206 wall or mating surface and the chamber wall or mating surface. In some embodiments, the interface can also include a weld bead 290, or instead of the weld bead, a clamp, screw, junction, or other clamping means can be provided. The LCV 202' is therefore shown connected to gas lines 320 and 322 by way of inlet valve 104 and outlet valve 106, so as to provide source gas to the LCV 202', which is then delivered to the reactor 120 for delivery by the showerhead 108 for processing a substrate 110 over a pedestal 112.

Figure 9:
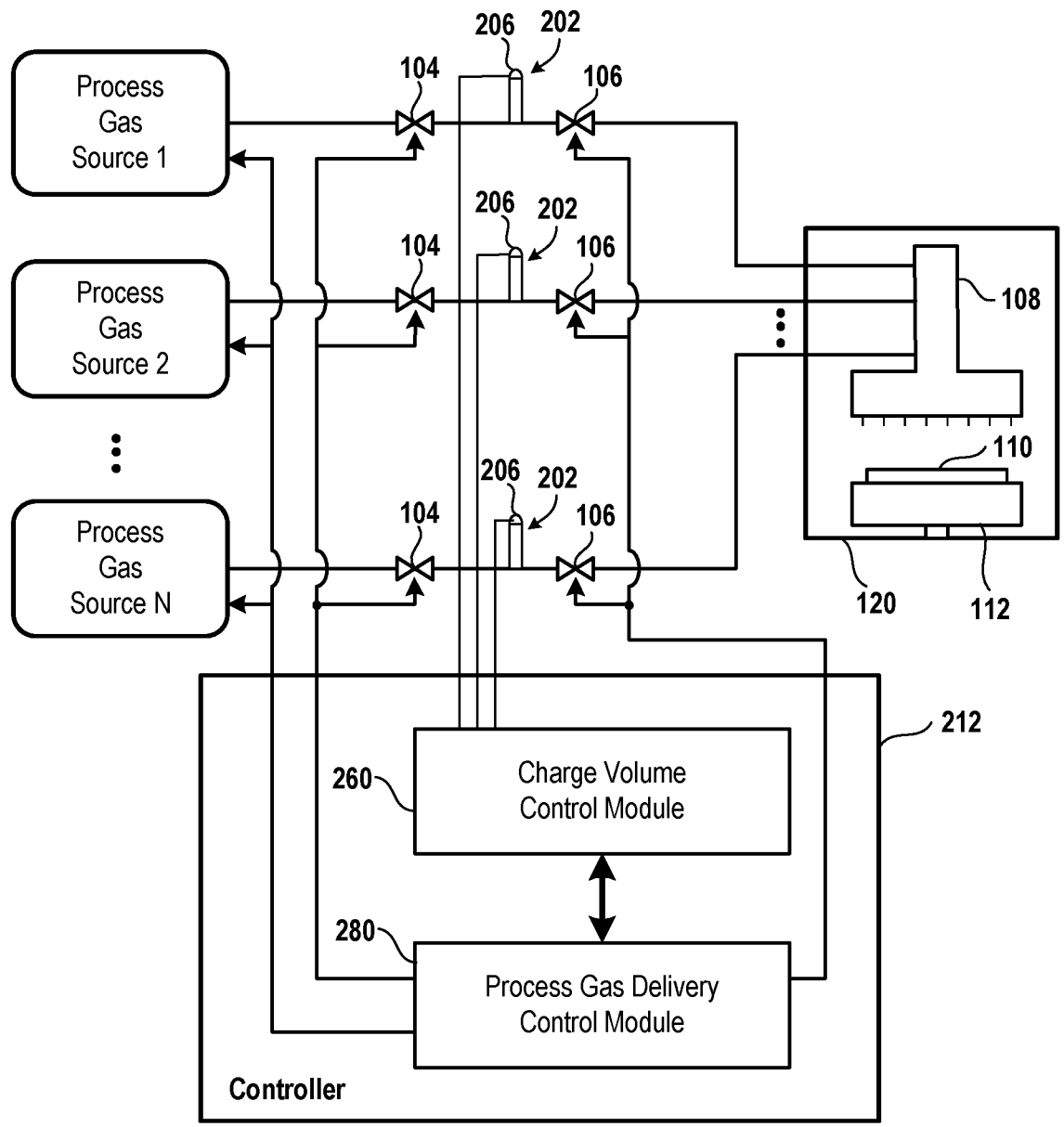
FIG. 9 shows a system diagram where integrated line charge volumes are used along different delivery gas line paths to a reactor, and use of the controller for sensing the pressure within the line charge volumes and control for delivering gases to the reactor.

FIG. 9 illustrates an example system diagram, which utilizes line charge volumes (LCVs) 202 for delivering controlled bursts of process gases from various sources to the showerhead 108. The charge of volume control module 260, which is part of the controller 212, is interfaced with each of the pressure sensors 206. The charge volume control module 260 will therefore interface with a process gas delivery control module 280. The process gas delivery control module 280 is configured to interface with the various process gas sources including the inlet valves 104 and outlet valves 106, so as to coordinate the delivery of gas from each of the LCVs 202 to the showerhead 108 and precision delivery of gas to the reactor 120.

As mentioned above, various LCVs 202 may be used along various lines of delivery of gas to the reactor 120, and the physical size of each one of the LCVs 202 can be selected based on the type of gas being delivered, based on the recipe used for processing the substrate 110, and other process engineering considerations.

Figure 10:
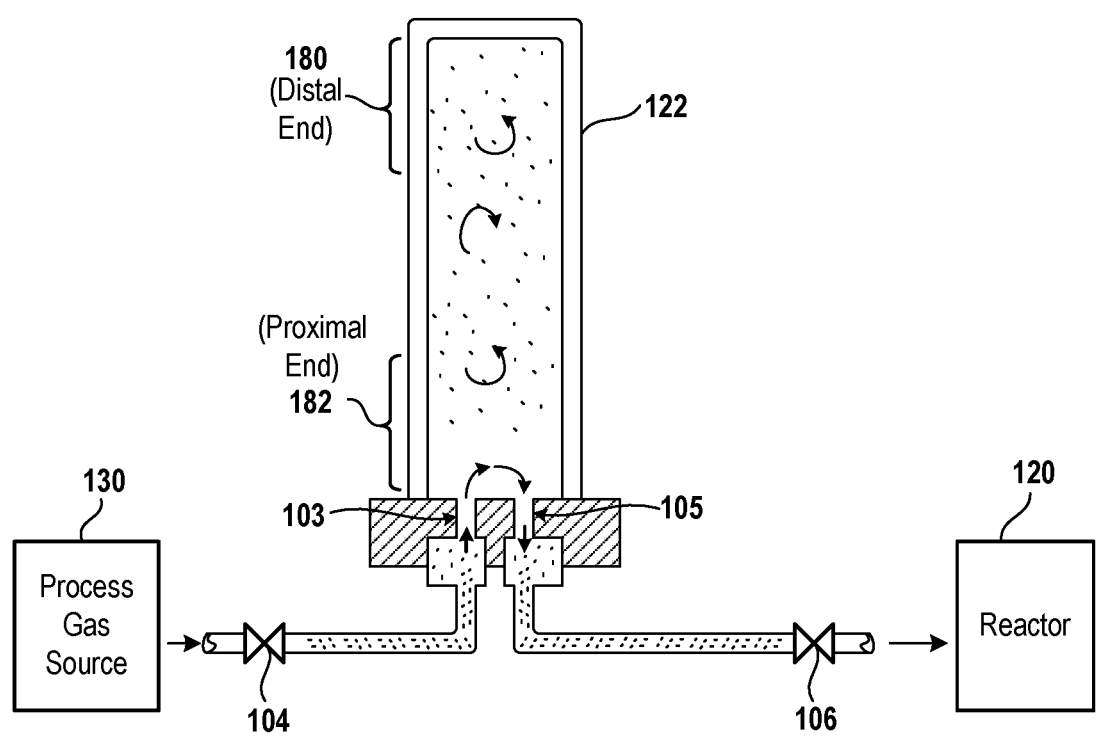
FIG. 10 illustrates an example of a flow through the charge volume.

FIG. 10 illustrates a single-ended design of a charge volume 122 that functions as a surface mount integrated gas system (IGS) flow control. As mentioned with reference to FIG. 2, this design does not lend itself to proper purging of residual atmospheric oxygen or water vapor. For example, when purge gases flow into and out of the charge volume 122, the proximity of the outlet port 105 to the inlet port 103 cause purge flow to be short circuited. That is, an amount of purge gas in a proximal end 182 flowing into inlet 103 may immediately flow out of outlet port 105. Further, due to the narrow-tall design and the placement of the inlet and outlet ports, significant recirculation occurs. As a result, purging of the distal end 180 of the charge volume 122 is ineffective. This is especially true with the aspect ratios of these narrow-tall designs that have a length to diameter is on the order of 10:1. Inefficiency in purging also has the downside of increasing purge time of the system.

Figure 11A:
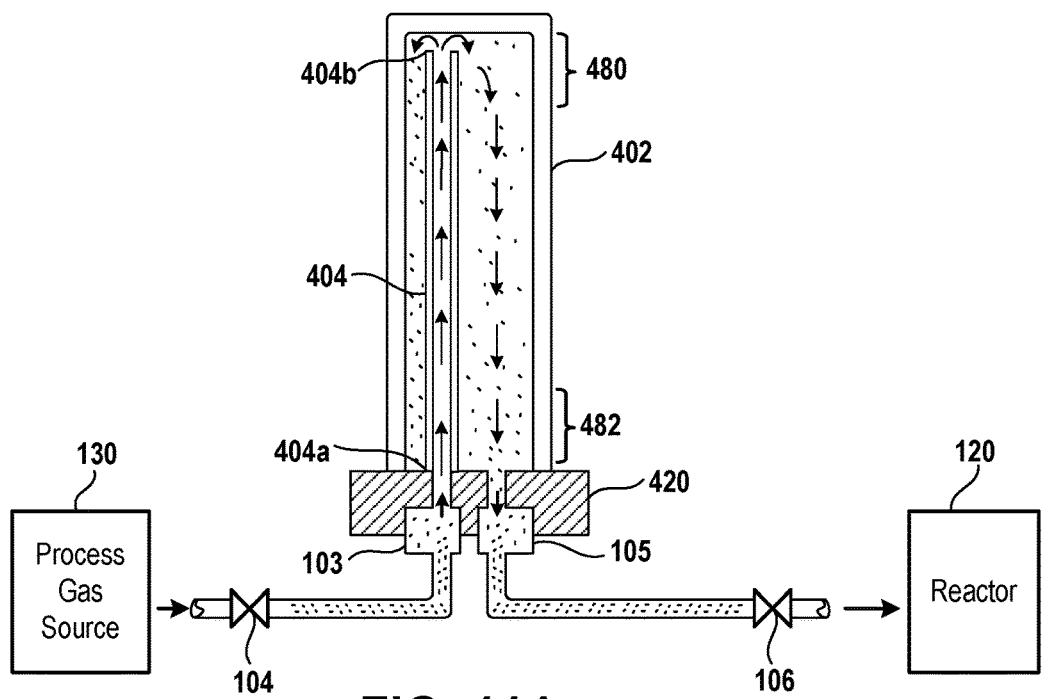
FIG. 11A illustrates an example of a flow-through charge volume that has an integrated internal tube for delivering gases into the charge volume from a location that is spaced apart from the outlet port of the charge volume, in accordance with one embodiment.

FIG. 11A illustrates an example of a charge volume 402 that has been modified to include a tube 404, disposed within the charge volume 402, in accordance with one embodiment. In one embodiment, the tube 404 has a diameter that is less than a diameter of the chamber of the charge volume 402. By way of example, the diameter of the tube 404 is about 0.5 times the diameter of the chamber or less. In another example, the diameter of the tube 404 is about 0.3 times the diameter of the chamber or less. In another example, the diameter of the tube 404 is about 0.2 times the diameter of the chamber or less. In some embodiments, the total volume inside the chamber 402 is the volume in the chamber 402 plus the volume in and around the tube 404, which is constant. As shown in FIG. 11C, the dynamic performance of the volume is governed by a time constant ($\tau=V/C$), where V is the total volume and C is the limiting conductance. For lowest time constant, it is desired to have the conductance of the tube 404 to be approximately equal to the conductance of the region around the tube 402. Another parameter that can be optimized for improved dynamic performance is the concentration transient as observed by the reactor, which should be as fast as possible for fastest possible purging performance. The illustrative curves of FIG. 11C show a composite plot of both transient pressure decay curves as well as transient concentration in the reactor. In the graph, the "+" indicates greater time constant or conductance and the minus indicates less. The concentration transient is determined by how fast the entire slug of chemistry moves out of the LCV. Therefore, D2 should be small enough that the Peclet number is >10 to prevent back diffusion. Further, since the mass of vapor is constant, if it can rush out faster because the conductance is higher, then for a representative vacuum system that continues to be pumped on, the peak concentration will be higher, but the concentration will drop faster. Again, the C+ indicates larger conductance.

In this configuration, a chamber of the charge volume 402 extends between a first end and a second end. By way of example, the chamber may have a tubular or cylindrical shape. The first end includes an inlet port 103 and an outlet port 105. This configuration shows that a connection end 404a of the tube 404 is coupled to the base 420 where the chamber of the charge volume 402 is also connected. The tube 404 is configured to extend within the charge volume 402 toward a distal end 480. The tube 404 has an output end 404b, which discharges gases within the charge volume 402 in the distal end 480. The output end 404b of the tube 402 has a direct opening that is aligned with the inlet port 103 of the base 420. The discharged gases will therefore travel the distance of the length of the charge volume 402 before exiting from the outlet port 105 at the proximal and 482. In this manner, the inlet port 103 is essentially moved to the output end 404b.

It is further believed that defect performance of the overall system incorporating a tube 404 in the charge volume 402 improves purging performance. Further, inadequate purging may lead to unwanted, parasitic reactions between process chemistry and residual oxygen and/or water vapor in the system. As shown below, in this configuration, a fundamental aspect is that the output end 404b that provides the gas input 432 for fluid into the chamber of the charge volume 402 is largely disposed at an opposite end within respect to the gas output 434. A further aspect of this embodiment is that the footprint of the charge volume 402 remains unchanged, as compared to charge volumes 122 that lack the tube 404 integrated therein.

Figure 11B:
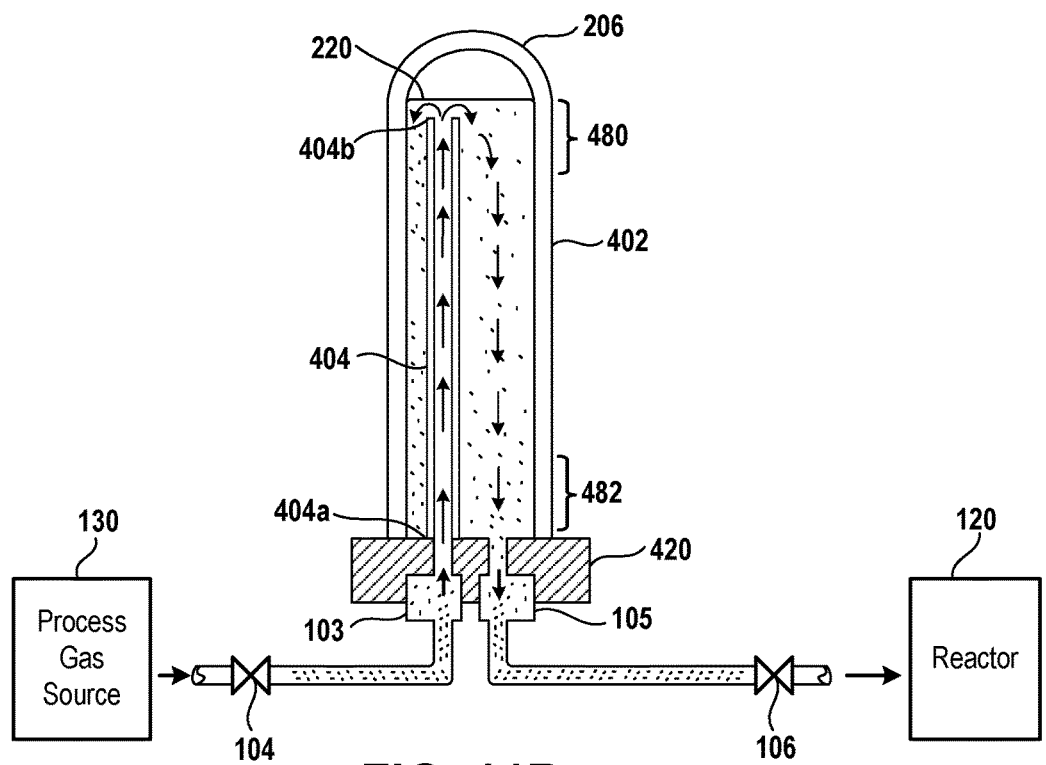
FIG. 11B illustrates another configuration of a charge volume that includes the integrated tube as well as an integrated pressure sensor, in accordance with one embodiment.
Figure 11C:
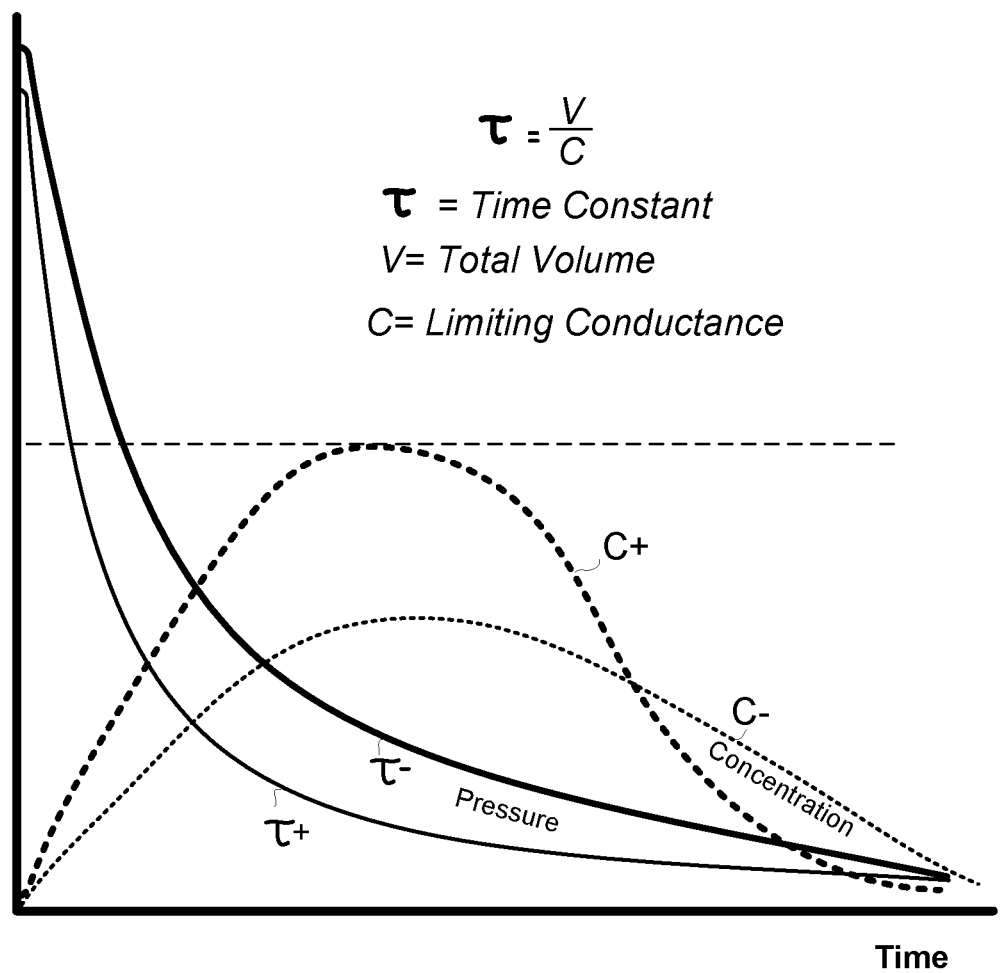
FIG. 11C illustrates a composite plot of both transient pressure decay curves as well as transient concentration in the reactor.

FIG. 11B shows one configuration, where the charge volume 402 of FIG. 11A may be modified to include a pressure sensor 206 of FIG. 3A, coupled to a top region of the chamber of the charge volume 402. In this manner, the chamber of the charge volume 402 will include the tube 404 and also the pressure sensor 206, such that fluid momentum out of the output end 404b of tube 404 still reaches the diaphragm of 220 of the pressure sensor 206. In this configuration, the dimension D1 is defined to be at least some dimensional value so that fluid momentum transfer to a diaphragm (if present) is maintained. This configuration therefore provides the benefit of accurate pressure sensing via the integrated pressure sensor and the improved purging of the integrated tube 404 disposed within the charge volume 402.

Figure 12:
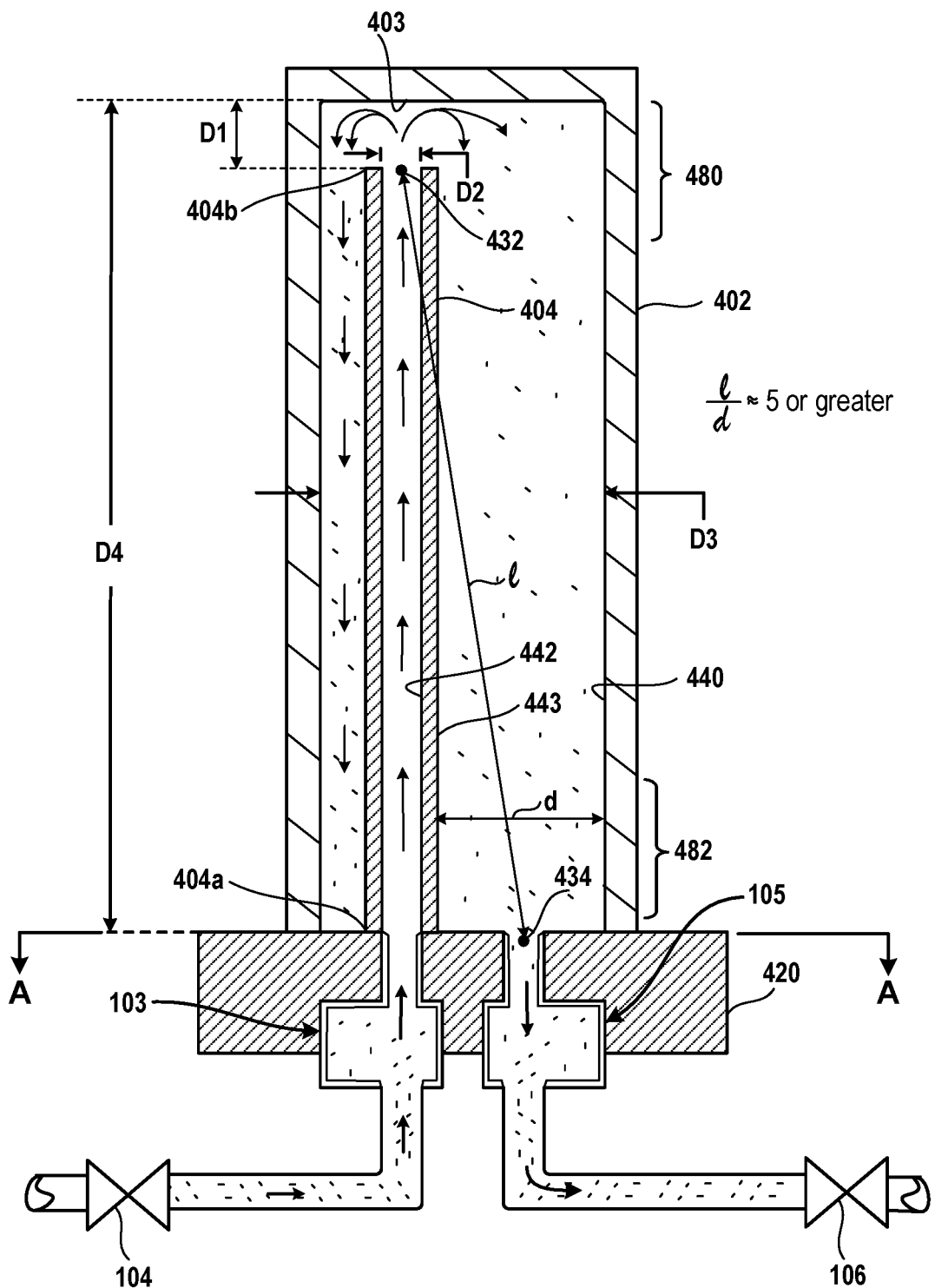
FIG. 12 illustrates another configuration of the charge volume having an integrated tube disposed therein, and its orientation relative to the resulting gas input at a distal and relative to the gas output at a proximal end, in accordance with one embodiment.

FIG. 12 illustrates a more detailed diagram of the charge volume 402, in accordance with one embodiment. In this configuration, it is shown that the tube 404 has the connection end 404a couple to the base 420. In one configuration, the tube 404 will have a tube inner surface 442 that directly interfaces with the gas line supplying the gas into the charge volume 402. In one embodiment, the tube 404 can be welded to the base 420 before the base is connected to the body of the charge volume 402. In some embodiments, the tube 404 can be screwed into a threaded portion of the base 420. In some embodiments, the tube 404 can be connected to the base utilizing a clamp, adhesive, O-rings, or other connecting structures. In one embodiment, the tube 404 is a stainless steel tube having sufficient rigidity to withstand pressure differentials within the charge volume 402, and remain substantially vertical within the charge volume 402 when pressure changes occurred due to gases being pumped in or pumped out during operation.

In this example, the output end 404b of the tube 404 is disposed at a dimension D1 that defines a separation between the output end 404b and the top surface 403 of the charge volume 402. In one embodiment, the dimension D1 can range between about 0.5 mm and about 6 mm, and in one embodiment is about 3 mm.

In this example, the dimension D2 is inner diameter of the tube 404 defines the gas inputs 432 into the charge volume 402. In one embodiment, dimension D2 can range between about 2 mm and about 0.9*D3 mm, and in one embodiment is about 6 mm.

In this example, the charge volume 402 may have an inner diameter that defines a dimension D3 of the charge volume 402. In one embodiment, dimension D3 can range between about 8 mm and about 25 mm, and in one embodiment is about 20 mm or about 25 mm.

In this example, the charge volume 402 may have an inner length that defines a dimension D4 of the charge volume 402. In one embodiment, dimension D4 can range between about 20 mm and about 160 mm, and in another embodiment can range between about 50 mm and 100 mm, and in one embodiment is about 70 mm.

By way of example, the gas input 432 that exits the tube 404 will be at a length (l) separation to the gas output 434 exiting the outlet port 105. A distance (d) is defined between the outer wall of the tube 404 and the chamber volume inner surface 440. In one configuration, the charge volume 402 will preferably have a ratio of length (l) divided by distance (d) of about 5 or greater. This example dimensioning will ensure that gases being supplied into the charge volume 402 by way of tube 404 can be utilized to press and push out gases at the distal end 480 toward the proximal and 482. In an alternate configuration, it is possible to integrate more than one tube 404 within the chamber of the charge volume 402. By way of example, to control the location at which fluid is introduced into the chamber, it may be possible to introduce one or more additional shorter tubes (not shown), which may be placed adjacent to the tube 404. The shorter tubes may themselves have different lengths, so as to enable delivery of gases at different heights. A controller can be connected to various valves to control an amount of fluid provided to each of the tubes.

Figure 13:
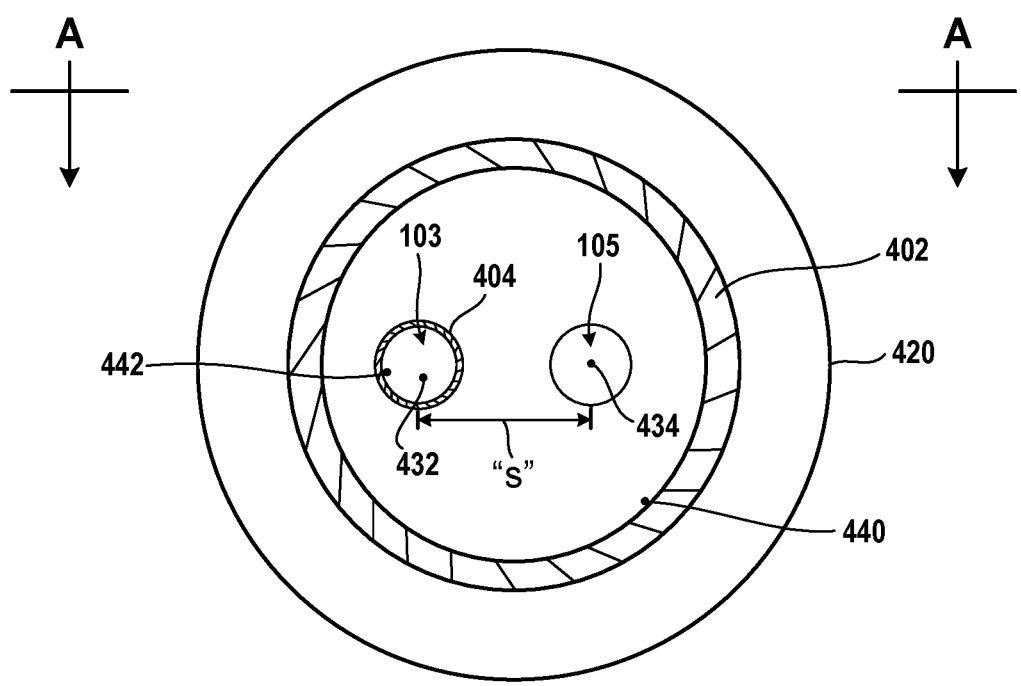
FIG. 13 illustrates a cross-sectional view of the charge volume of FIG. 12, wherein the base receives the chamber of the charge volume as well as the tube that is integrated and connected to the base.

FIG. 13 illustrates one example of a cross section A-A shown in FIG. 12, in accordance with one embodiment. As shown, the base 420 is configured to support the structure of the charge volume 402. The base 420 can take on any number of dimensions, and is shown here as being circular simply for purposes of illustration. In some embodiments, the base 420 can be rectangular or can be a surface that supports a number of charge volumes 402.

The tube 404 may be positioned within the base 420 in a number of ways. The illustration provided in FIG. 13 is that the tube 404 is positioned beside or adjacent to the outlet port 105. However, it should be understood that the separation between the tube 404 and the outlet port 105 can vary, depending on the desired construction. However, no matter the construction and placement of the tube 404 relative to the outlet port 105, the gas input 432 will be sufficiently separated from the gas output 434 leading to the outlet port 105. As mentioned above, the separation will have a dimension (l), and a separation (d) is shown between an outer wall 443 of the tube 402 and the chamber volume inner surface 440. In this configuration, the separation (d) is between the outer wall 443 and the chamber volume inner surface 440, and wherein the outlet port 105 resides in between. Thus, the ratio of (l) divided by (d) is maintained to be at least 5 or greater.

As further shown, the tube 404 that is connected to the inlet port 103 is spaced apart by separation "S" from the outlet port 105 of the base 420. This separation is preferably at least large enough so that the tube 402 can be connected to the base 420, and space remains between the outer wall 443 of the tube 402 and the outlet port 105. In one embodiment, the separation "S" is at least about 9 mm, for a configuration where D4 is between 20 mm and 160 mm and D3 is about 25 mm. In some configurations, a plurality of charge volumes 402 are used for supplying gases 130 to a reactor 120. Depending on the process recipe used for processing a substrate, the plurality of charge volumes 402 can be defined from various size charge volumes 402. The different sizing in charge volumes 402 is used to make the delivery of gas more efficient during processing. For instance, delivery of some gases require smaller amounts while delivery of other gases require larger amounts. Accordingly, the tube 404 implemented within the charge volume 402 may be implemented in different size charge volumes 402. Some sizes are simply limited in the dimension D4, while in other implementations both the dimension D4 and D3 may change depending on the configuration. Further, depending on the configuration, the length of the tube 404 and the dimension D1 will also change.

The designs described in FIGS. 11-13 therefore overcome a deficiency with surface mount charge volumes. In addition, green-to-green times and cost of consumables (CoC) are both improved because purging of the charge volume is significantly improved. In addition, defect performance of the overall system incorporating a charge volume 402 is improved, as inadequate purging leads to unwanted, parasitic reactions between process chemistry and residual oxygen and water vapor in the system.

Figure 14:
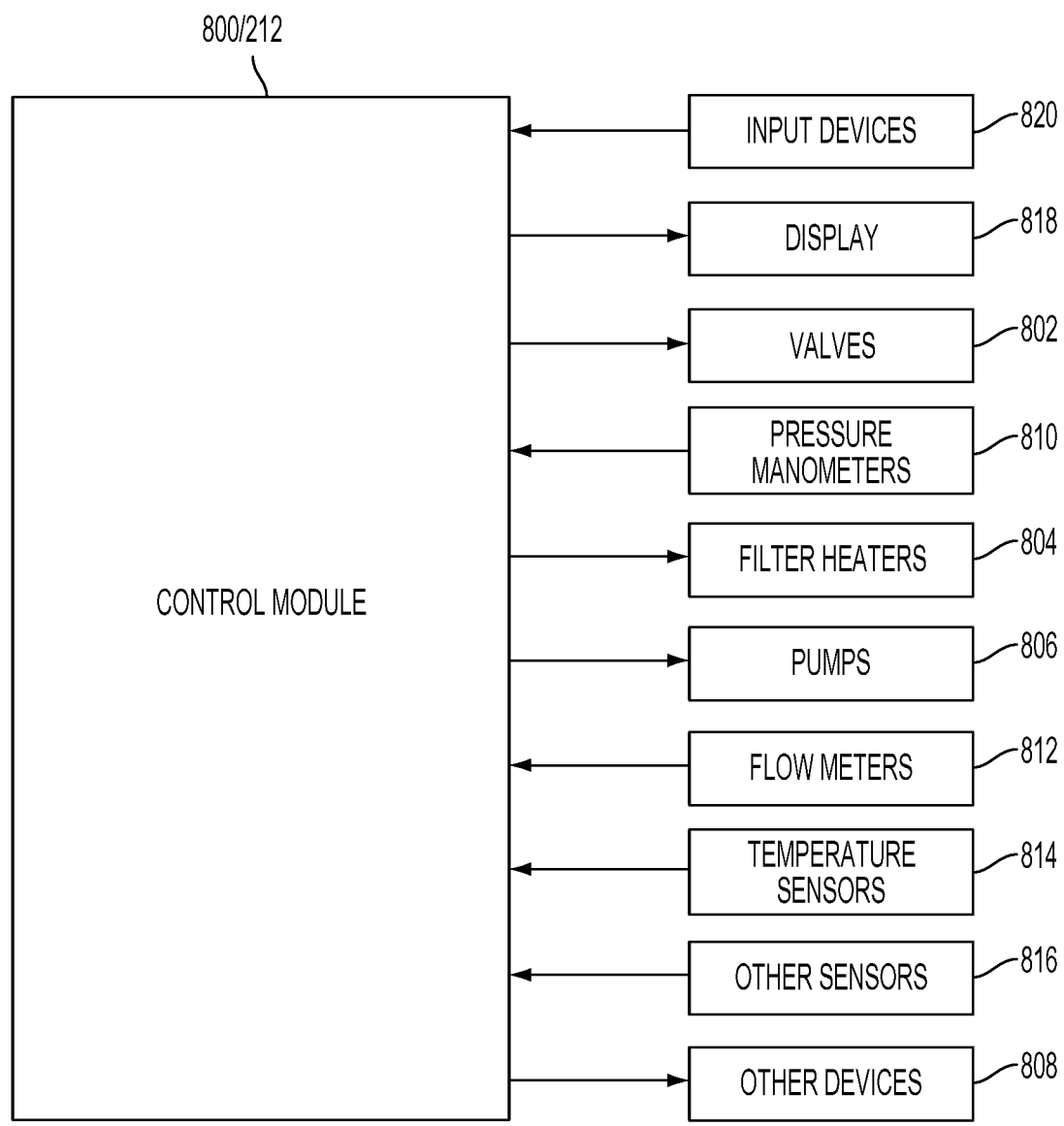
FIG. 14 shows a control module 800 for controlling the systems described above.

FIG. 14 shows a control module 800 for controlling the systems described above. In one embodiment, the control module 112 of FIGS. 3A, 7A, 8A, 8B, 9, and 12, may additionally include some of the example components. For instance, the control module 800 may include a processor, memory and one or more interfaces. The control module 800 may be employed to control devices in the system based in part on sensed values. For example only, the control module 800 may control one or more of valves 802, filter heaters 804, pumps 806, and other devices 808 based on the sensed values and other control parameters. The control module 800 receives the sensed values from, for example only, pressure manometers 810, flow meters 812, temperature sensors 814, and/or other sensors 816. In one embodiment, the pressure manometer 810 may be defined from one or more of the LCV 202, having a chamber 204 with an integrated pressure sensor 206, as described herein. The control module 800 may also be employed to control process conditions during precursor delivery and deposition of the film. The control module 800 will typically include one or more memory devices and one or more processors.

The control module 800 may control activities of the precursor delivery system and deposition apparatus. The control module 800 executes computer programs including sets of instructions for controlling process timing, delivery system temperature, pressure differentials across the filters, valve positions, mixture of gases, chamber pressure, chamber temperature, substrate temperature, RF power levels, substrate chuck or pedestal position, and other parameters of a particular process. The control module 800 may also monitor the pressure differential and automatically switch vapor precursor delivery from one or more paths to one or more other paths. Other computer programs stored on memory devices associated with the control module 800 may be employed in some embodiments.

Typically there will be a user interface associated with the control module 800. The user interface may include a display 818 (e.g. a display screen and/or graphical software displays of the apparatus and/or process conditions), and user input devices 820 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the substrate chuck.

Examples of sensors that may be monitored during deposition include, but are not limited to, mass flow control modules, pressure sensors such as the pressure manometers 810, and thermocouples located in delivery system, the pedestal or chuck (e.g. the temperature sensors 814). Appropriately programmed feedback and control algorithms may be used with data from these sensors to maintain desired process conditions. The foregoing describes implementation of embodiments of the disclosure in a single or multi-chamber semiconductor processing tool.

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" of all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Reference may also be made to U.S. Pat. Nos. 8,906,791, 6,428,859 and 6,627,268, which provide example structure and/or methods that may be used in some embodiments described herein. These patents are incorporated by reference herein.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A system for processing a substrate, the system includes a charge volume for use in delivery of gas to a process chamber of the system, comprising:
    a process gas source;
    the charge volume includes a chamber having a tubular shape extending between a proximal end and a distal end;
    a base integrated to the proximal end of the chamber, the base includes an inlet port and an outlet port, such that the inlet port is separated from the outlet port by a separation; and
    a tube disposed within the chamber, wherein the tube has a tube diameter that is at least 0.5 times a chamber diameter of the chamber, the tube having a connection end coupled to the base so as to surround the inlet port at the proximal end of the chamber and an output end disposed at the distal end of the chamber;
    wherein the output end of the tube has an opening that is aligned with the inlet port of the base.

2. The system of claim 1, further comprising,
    an inlet valve interfaced between a gas delivery controller and the inlet port;
    an outlet valve interfaced between the outlet port and the process chamber.

3. The system of claim 1, wherein a length (l) is defined between the output end of the tube and the outlet port of the base and a distance (d) is defined between an outer wall of the tube and a charge volume inner surface, wherein a ratio of (l)/(d) is about 5 or greater.

4. The system of claim 1, further comprising,
    a process source coupled to an inlet valve, the inlet valve being connected to the inlet port of the base;
    the outlet port of the base being coupled to an outlet valve, the outlet valve being connected to the process chamber;
    a controller interfaced with the inlet valve and the outlet valve for controlling flow of process gases and purge gases to the charge volume and to the process chamber.

5. The system of claim 1, further comprising,
    a pressure sensor integrated to the chamber at the distal end, the pressure sensor having a diaphragm exposed to an interior of the chamber.

6. The system of claim 5, wherein the pressure sensor has a measurement side for measuring a deflection of a diaphragm, the diaphragm being directly exposed to the interior of the chamber so that pressure produced by a gas that is provided into the chamber via the output end of the tube produces a force upon the diaphragm.

* * * * *